(12) United States Patent
Yatsuki et al.

(10) Patent No.: US 7,936,803 B2
(45) Date of Patent: May 3, 2011

(54) EXTERNAL CAVITY SEMICONDUCTOR LASER

(75) Inventors: Miki Yatsuki, Chiyoda-ku (JP);
Tokutaka Hara, Chiyoda-ku (JP);
Masahito Mure, Chiyoda-ku (JP)

(73) Assignee: Sumitomo Osaka Cement Co., Ltd., Chiyoda-ku, Tokyo (JP)

( * ) Notice: Subject to any disclaimer, the term of this patent is extended or adjusted under 35 U.S.C. 154(b) by 179 days.

(21) Appl. No.: 11/887,063

(22) PCT Filed: Mar. 24, 2006

(86) PCT No.: PCT/JP2006/305947
§ 371 (c)(1),
(2), (4) Date: Sep. 24, 2007

(87) PCT Pub. No.: WO2006/104034
PCT Pub. Date: Oct. 5, 2006

(65) Prior Publication Data
US 2009/0059990 A1    Mar. 5, 2009

(30) Foreign Application Priority Data

Mar. 25, 2005  (JP) ................................. 2005-089635
Mar. 25, 2005  (JP) ................................. 2005-089825
Oct. 17, 2005  (JP) ................................. 2005-301321

(51) Int. Cl.
*H01S 3/083* (2006.01)
(52) U.S. Cl. ............... 372/94; 372/98; 372/99; 372/100
(58) Field of Classification Search ................ 372/94, 372/98–100
See application file for complete search history.

(56) References Cited

U.S. PATENT DOCUMENTS 4,905,252 A    2/1990  Goldberg et al.
5,524,012 A *  6/1996  Wang et al. ................ 372/23
(Continued)

FOREIGN PATENT DOCUMENTS

JP     58-071687    4/1983
(Continued)

OTHER PUBLICATIONS

Raab et al. "Tuning high-power laser diodes with as much as 0.38 W of power and $M^2$=1.2 over a range of 32 nm with 3-GHz bandwidth." *Optical Society of America*. vol. 27. No. 22. 2002. pp. 1995-1997.

(Continued)

*Primary Examiner* — Tod T Van Roy
(74) *Attorney, Agent, or Firm* — Merchant & Gould P.C.

(57) ABSTRACT

An external cavity semiconductor laser including a first and second input-output section disposed on a common end surface via a center axis, and a semiconductor laser device emitting a first and second laser light from the first and second input-output sections in two directions. The laser device includes a first reflecting unit for reflecting the first laser light emitted from the first input-output section and returning the reflected first laser light to the first input-output section, a second reflecting unit for reflecting the second laser light emitted from the second input-output section and returning the reflected second laser light to the second input-output section, a third reflecting unit provided to a second end surface disposed opposite a first end surface having first and second input-output sections for reflecting laser light returned to one of the input-output sections so as to be emitted from the other one of the input-output sections.

2 Claims, 15 Drawing Sheets

U.S. PATENT DOCUMENTS

| | | |
|---|---|---|
| 5,572,542 A | 11/1996 | Dixon |
| 6,212,216 B1 | 4/2001 | Pillai |
| 6,885,687 B2 | 4/2005 | Hayakawa |
| 2004/0228385 A1 | 11/2004 | Raab et al. |

FOREIGN PATENT DOCUMENTS

| | | |
|---|---|---|
| JP | 01-152787 | 6/1989 |
| JP | 01-181590 | 7/1989 |
| JP | 2005-089825 | 4/1990 |
| JP | 2005-089825 | 8/1990 |
| JP | 2005-301321 | 8/1990 |
| JP | 08-307006 | 11/1996 |
| JP | 09-129982 | 5/1997 |
| JP | 11-503575 | 3/1999 |
| JP | 2001-143648 | 5/2001 |
| JP | 2001-308454 | 11/2001 |
| WO | WO 03/036766 A2 * | 5/2003 |
| WO | WO 03/055018 | 7/2003 |

OTHER PUBLICATIONS

Raab et al. "External resonator design for high-power laser diodes that yields 400 mW of $TEM_{00}$ power." *Optical Society of America.* vol. 27. No. 3. 2002. pp. 167-169.

* cited by examiner

EXTERNAL CAVITY SEMICONDUCTOR LASER

TECHNICAL FIELD

The present invention relates to external cavity semiconductor lasers, more particularly to external cavity semiconductor lasers using semiconductor laser devices capable of emitting laser light in at least two directions from a common end surface.

The present application is based on patent application No. 2005-89825 filed Mar. 25, 2005, in Japan, patent application No. 2005-89635 filed Mar. 25, 2005, in Japan, and patent application No. 2005-301321 filed Oct. 17, 2005, in Japan, the content of which are incorporated herein by reference.

BACKGROUND ART

Conventionally, semiconductor lasers are used for small coherent light sources in various technologies, e.g., optical communication, optical measurement, and optical fabrication. However, semiconductor lasers in general have problems, e.g., small optical output, wavelengths and light amounts vulnerable to change in temperature, and increased spectrum in width in accordance with greater driving current supplied by a semiconductor laser for greater optical output. In contrast, external cavity semiconductor lasers achieve stable optical output that provide the feedback of a part of the laser light (a certain wavelength of light) emitted by a semiconductor laser device and amplify a specific wavelength of light. For example, Patent Document 1 proposes a configuration where only a specific wavelength of backbeam emitted by a semiconductor laser device is returned to the semiconductor laser device by a lens and a holographic diffraction grating.

An external cavity semiconductor laser making use of the high output characteristics of a gain waveguide semiconductor laser has been proposed recently. Laser light are emitted from a common surface in two different directions that are offset from a center axis of a waveguide in a laser device in a gain waveguide semiconductor laser (grain-waveguide diode laser). Thus, an external cavity semiconductor laser using a gain waveguide semiconductor laser provides feedback of one laser light to a semiconductor laser device and makes use of the other laser light, i.e., output light. Non-Patent Documents 1 and 2, and Patent Document 2 describe examples of external cavity semiconductor lasers using a gain waveguide semiconductor laser.

FIG. 17 illustrates an external cavity semiconductor laser disclosed by the Non-Patent Document 1. Laser lights 108 and 109 are emitted in two different directions from a first end surface 2 of a semiconductor laser device 101 of a gain waveguide semiconductor laser so that the laser lights 108 and 109 are offset from an optical axis 108 of a waveguide in the semiconductor laser device 101. Provided to collimate the two laser lights are a fast axis collimator (FAC) 102 and a slow axis collimator (SAC) 103. One of the laser light, i.e., the laser lights 108 and 109 having passed through the fast axis collimator (FAC) 102, slow axis collimator (SAC) 103, and an aperture 105a are reflected by a high-reflection (HR) mirror 104 and further passed through the aperture 105a, the slow axis collimator (SAC) 103, and the fast axis collimator (FAC) 102, then returned to the semiconductor laser device 101 to form an external cavity laser light. The other one of the light, i.e., the laser light 109 passing through the fast axis collimator 102, the slow axis collimator 103, and an aperture 105b and being emitted is an output laser light.

In the case of external cavity semiconductor laser illustrated in FIG. 17, the semiconductor laser device 101 has a reflecting coating (reflecting unit) 106 on a second end surface 101d disposed opposite the first end surface 101c. The laser lights 108 and 109 reflected by the reflecting mirror 104 and returned to the semiconductor laser device 101 are further reflected by the reflecting coating 106, and then emitted again from the first end surface 101c. A one-half part 101a of an active layer of the semiconductor laser device 101 is an optical path of an external cavity that emits one of the laser light, i.e., the laser light 108 forming the external cavity laser light. Another half part 101b is an optical path that emits the other output laser light 109.

The external cavity semiconductor laser disclosed by Non-Patent Document 2 obtains laser light having a decreased width of spectrum. As illustrated in FIG. 18, laser lights 118 and 119 are emitted from an external cavity semiconductor laser in two directions that are offset from the optical axis of a waveguide in a semiconductor laser device 110. Configured for the laser light 118 is an external cavity optical system where a part of the laser light emitted from a semiconductor laser device 110 passes through a fast axis collimator (FAC) 111, a lens 112, and an aperture 113, and corrected to parallel light by a lens 114. The corrected parallel light is adapted to a specific wavelength of light by an etalon 115 and a diffraction grating 116. In FIG. 18, a design idea is shown for increasing wavelength selectivity by adjusting the etalon 115 and adjusting the angle of the diffraction grating 116. Meanwhile, a reference numeral 117 in FIG. 18 indicates a reflecting unit that introduces the output laser light 119 to the exterior thereof.

The basic configuration of the external cavity semiconductor laser disclosed by Patent Document 2 is the same as that shown in FIG. 18. As illustrated in FIG. 19, a portion 124 of the laser emitted by a semiconductor laser 120 is incident into a cylindrical lens 121 followed by an etalon 122 and a diffraction grating 123, and a reflected light 125 is returned to the semiconductor laser 120. Another laser light emitted by the semiconductor laser 120 becomes output laser light 126 to be radiated.

[Patent Document 1] Japanese Unexamined Patent Application, First Publication No. S58-71687
[Patent Document] WO03/055018A1
[Non-Patent Document 1] Volker Raab, et al., "External resonator design for high-power laser diodes that yield 400 mW of TEM00 power", p167-169, vol.27, No.3, OPTICS LETTERS, Feb. 1, 2002
[Non-Patent Document 2] Volker Raab, et al., "Tuning high-power laser diodes with as much as 0.38 W of power and M2=1.2 over a range of 32 nm with 3-GHz bandwidth," p1995-1997, Vol.27, No. 22, OPTICS LETTERS, Nov. 15, 2002

DISCLOSURE OF INVENTION

Problems to be Solved by the Invention

The obtainable output in an external cavity semiconductor laser using the previously-explained gain waveguide semiconductor lasers is substantially a half because a half of the active layer of a semiconductor laser device serves as an optical path coupled to an external cavity while the other half serves as an optical path that outputs laser light (see FIG. 17).

The external cavity laser light returned to the semiconductor laser device is reflected by a reflecting coating and reemitted from a first end surface. While a part of the external cavity laser light refracted in the semiconductor laser device returns to the path of the external cavity laser light, most of the external cavity laser light is emitted to the optical path of the external cavity laser light. The conventional external cavity semiconductor laser is thus difficult to form a stable standing wave in the optical path of the external cavity laser light.

In an external cavity semiconductor laser using the previously-explained gain waveguide semiconductor laser, a focal distance x (see FIG. 20) of the fast axis collimator (FAC) is significantly different from a focal distance y (see FIG. 17 or FIG. 18) of the slow axis collimator (SAC) by a ratio of 1:10, etc. Therefore the spreading angles of the output laser light different in the horizontal direction and the vertical direction produce anastigmatism when focusing the laser light by using a lens. A possible bad influence caused by this phenomena may be a loss (coupling loss) produced when coupled to an optical waveguide.

Considering the foregoing circumstances, an object of the present invention is to provide an external cavity semiconductor laser capable of emitting high power output laser light.

Furthermore, another object of the present invention is to provide an external cavity semiconductor laser less complex in structure, i.e., having less number of parts, so that anastigmatism is eliminated from the emitted laser light.

Means for Solving the Problems

An external cavity semiconductor laser according to the present invention includes: a semiconductor laser device having a first input-output section and a second input-output section disposed on a common end surface thereof, a center axis being disposed between the first input-output section and the second input-output section, the semiconductor laser device being capable of emitting laser light in two directions from the first input-output section and the second input-output section; a first reflecting unit for reflecting the laser light emitted from the first input-output section to return the reflected laser light to the first input-output section; a second reflecting unit for reflecting the laser light emitted from the second input-output section to return the reflected laser light to the second input-output section; a third reflecting unit disposed on a second end surface positioned opposite a first end surface of the semiconductor laser device having the first input-output section and the second input-output section, the third reflecting unit reflecting the laser unit having returned to the first end surface so as to emit the reflected laser light from the first input-output section or the second input-output section; and an output unit for outputting a part of the laser light as an output laser light.

The external cavity semiconductor laser according to the present invention has a folded external cavity optical path where laser light reciprocates through the first input-output section, the third reflecting unit, and the second input-output section. Therefore the external cavity can utilize the entire active layer of the semiconductor laser device and thus, high power output can be obtained. This is since the multitime-reciprocated laser light in the external cavity optical path between the first reflecting unit and the second reflecting unit enables forming of a stable standing wave.

The output unit may be disposed in the optical path of the laser light in the external cavity semiconductor laser of the present invention.

The external cavity semiconductor laser according to the present invention allows the laser light to be output at an appropriate position on the optical path of the external cavity.

The output unit may be disposed to the first or second reflecting unit in the external cavity semiconductor laser according to the present invention. The external cavity semiconductor laser according to the present invention allows the output unit to compatibly work as a laser light-reflecting unit, thereby avoiding an increase in the number of components.

An external cavity semiconductor laser according to the present invention includes: a semiconductor laser device having a first input-output section and a second input-output section disposed on a common end surface thereof, a center axis being disposed between the first input-output section and the second input-output section, the semiconductor laser device being capable of emitting laser light in two directions from the first input-output section and the second input-output section; an optical path-changing unit for changing the optical path of the laser light emitted from the second input-output section and returning the changed laser light to the first input-output section; a unidirectional transmission unit for passing the laser light emitted from the second input-output section and blocking the laser light emitted from the first input-output section; a reflecting unit disposed on a second end surface positioned opposite a first end surface of the semiconductor laser device having the first input-output section and the second input-output section, the reflecting unit reflecting the laser unit having returned to the first end surface so as to emit the reflected laser light from the first input-output section or the second input-output section; and an output unit disposed in the optical path of the laser light for outputting a part of the laser light as an output laser light.

The external cavity semiconductor laser according to the present invention has a loop shape of the external cavity optical path where laser light circulates through the second input-output section, the optical path-changing unit, the first input-output section, and the second end surface in this order. Therefore the external cavity can utilize the entire active layer of the semiconductor laser device; thus, high power output can be obtained. In addition, the loop-shaped external cavity optical path providing multi-loop resonation to the laser light can form a stable standing wave.

The semiconductor laser device may be a gain waveguide semiconductor laser in the external cavity semiconductor laser according to the present invention.

The external cavity semiconductor laser according to the present invention can provide high power laser light output.

The third reflecting unit may be a reflecting coating provided on the second end surface in the external cavity semiconductor laser according to the present invention.

The external cavity semiconductor laser according to the present invention can avoid interference or scattering of the laser light between the second end surface and the reflecting unit.

The output unit may be a half mirror for reflecting a part of the emitted laser light and transmitting the other part of the laser light in the external cavity semiconductor laser according to the present invention.

The external cavity semiconductor laser according to the present invention allows the output laser light to be taken out without affecting the resonation of the laser light in the external cavity optical path.

The external cavity semiconductor laser according to the present invention may further include at least an optical beam-rectifying device disposed on each optical path of the laser light.

The external cavity semiconductor laser according to the present invention can allow a common optical system to collimate the laser light emitted in two directions, thereby avoiding an increase in the number of components.

The optical beam-rectifying device may include a fast axis collimator and a slow axis collimator in the external cavity semiconductor laser according to the present invention.

The external cavity semiconductor laser according to the present invention allows the laser light to be collimated in two stages effectively.

In the external cavity semiconductor laser according to the present invention, the first and second reflecting units each may be a piece of reflecting mirror disposed on a line extending from the center axis of the semiconductor laser device, and the reflecting mirror may have a first reflecting section for reflecting the laser light emitted from the first input-output section; and a second reflecting section for reflecting the laser light emitted from the second input-output section.

The external cavity semiconductor laser according to the present invention allows a common reflecting mirror to reflect the laser light emitted in two directions and to return the reflected light to the laser device, thereby avoiding an increase in number of components.

The first and second reflecting units may be two reflecting mirrors separated from each other in the external cavity semiconductor laser according to the present invention.

The external cavity semiconductor laser according to the present invention allows the separately disposed reflecting mirrors to reflect the laser light emitted in two directions and to return the reflected light to the laser device, thereby avoiding an increase in the number of components.

In the external cavity semiconductor laser according to the present invention, the optical path-changing unit may be a prism disposed on a line extending from the center axis of the semiconductor laser device.

The external cavity semiconductor laser according to the present invention allows a piece of prism to change the optical path of the laser light and to return the changed light to the laser device, thereby avoiding an increase in the number of components.

In the external cavity semiconductor laser according to the present invention, the optical path-changing unit may include at least two reflecting mirrors each having a reflecting surface directed in different directions from each other.

The external cavity semiconductor laser according to the present invention capable of providing microadjustment to the reflecting surface of each reflecting mirror with respect to position and direction, thereby facilitating the adjustment of the optical path.

An external cavity semiconductor laser according to the present invention includes: a semiconductor laser device for emitting laser light in at least two directions from a common end surface thereof, one of the laser light emitted from the semiconductor laser device being external cavity laser light, and the other laser light being output laser light; an optical beam-rectifying device disposed in the optical path of the external cavity laser light and in the optical path of the output laser light; and a reflecting unit for reflecting only the external cavity laser light, wherein the optical beam-rectifying device comprises: a first laser spreading angle-adjusting section for condensing the laser light in a first direction orthogonal to a surface including the optical axis of the laser light emitted in two directions from the semiconductor laser device; and a second laser spreading angle-adjusting section for condensing the laser light in both a first direction and a second direction where the second direction is orthogonal to the direction of a center axis that divides the optical axes of two laser light emitted from the semiconductor laser device and orthogonal to the first direction.

In the external cavity semiconductor laser according to the present invention, the first laser spreading angle-adjusting section may be a fast axis collimator, and the second laser spreading angle-adjusting section may be a slow axis collimator.

In the external cavity semiconductor laser according to the present invention, the reflecting unit may be a partially-reflective mirror having a reflecting surface only in a region to which the external cavity laser light is emitted.

In the external cavity semiconductor laser according to the present invention, a filter layer for reflecting a specific wavelength of light to the reflecting surface of the external cavity laser light may be formed to the reflecting unit.

The external cavity semiconductor laser according to the present invention allowing the spreading of laser light emitted first from the semiconductor laser device to be condensed in the first direction orthogonal to the surface including the optical axes of the laser light emitted from the semiconductor laser in two directions can adjust the spreading angle of the laser light. The spreading angle of the laser light is subsequently adjusted by condensing the laser light in both a first direction and a second direction where the second direction is orthogonal to the direction of a center axis that divides the optical axes of two laser lights emitted from the semiconductor laser device and orthogonal to the first direction. That is, since the laser light in the first direction is collimated in two stages, and since the laser light in the second direction is collimated in a single stage, adjusting the spreading angles of both laser lights allows the cross sectional shapes of the laser lights to be rectified.

This allowing the spreading angles of the laser lights to coincide between the first direction (for example, a vertical direction) and the second direction (for example, a horizontal direction) causes both focal lengths of both laser lights to be apparently the same, thereby bringing the shape of the laser light in the vertical direction to the shape of the laser light in the horizontal direction as close as possible.

Effects of the Invention

The external cavity semiconductor laser according to the present invention can provide high power laser light output.

The external cavity semiconductor laser according to the present invention can output anastigmatism-free laser light. Furthermore, the less complex structure can reduce the number of components used in the external cavity semiconductor laser.

EXPLANATION OF REFERENCE NUMERALS AND SYMBOLS

Figure 1:
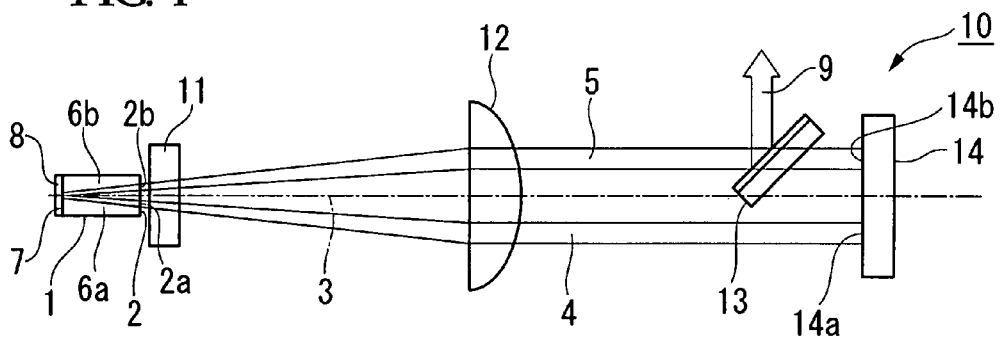
FIG. 1 is a schematic view illustrating a first embodiment of the external cavity semiconductor laser according to the present invention.

1: semiconductor laser device
2: first end surface
2a: first input-output section
2b: second input-output section
3: center axis
4: first laser light
5: second laser light
7: second end surface
8: reflecting unit (reflecting coating)
9: output laser light
10, 10A, 20, 20A, 20B, 30: external cavity semiconductor laser
11, 21, 31: fast axis collimator (FAC)
12, 22, 32: slow axis collimator (SAC)
13, 23: output unit (half mirror)
14, 15, 16, 34: reflecting mirror
14a, 14b: reflecting section
24: isolator
25: prism
26, 27: reflecting mirror
35: reflecting unit compatibly serving as output unit (half mirror)
61: semiconductor laser device
62: optical beam-rectifying device (first laser spreading angle-adjusting section)
63: optical beam-rectifying device (second laser spreading angle-adjusting section)
64: reflecting unit (reflecting mirror)
65: reflecting surface
66: filter layer
67: center axis
68: external cavity laser light
69: output laser light

BEST MODE FOR CARRYING OUT THE INVENTION

The best mode of the present invention is explained based on the best mode with reference to the drawings.

Explained first is a first embodiment of the external cavity semiconductor laser according to the present invention. FIG. 1 is a schematic view illustrating an external cavity semiconductor laser 10 according to the present embodiment.

Figure 2:
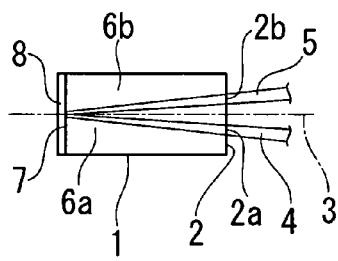
FIG. 2 shows the semiconductor laser device in enlarged view.

The external cavity semiconductor laser 10 is provided with a semiconductor laser device 1. As illustrated in FIG. 2 in enlarged view, the semiconductor laser device 1 used in the present invention is capable of emitting a first laser light 4 and a second laser light 5 in two directions from a common end surface 2 (this surface is sometimes called a first end surface). Disposed on the first end surface 2 is a center axis 3 positioned between a first input-output section 2a for emitting the first laser light 4 and a second input-output section 2b for emitting the second laser light 5. A specific example of the laser device may be a gain waveguide semiconductor laser. The active layer for laser of a gain waveguide semiconductor laser has a width range of 50 μm to 400 μm along the interface between a p-type semiconductor and a n-type semiconductor cemented together. Since a gain waveguide semiconductor laser has a property that bends emitted laser light in two directions, higher refractive indexes at both ends of the active layer based on an increase in driving current causes the active layer itself to work as a concave lens.

An example of the semiconductor laser device 1 adaptable for the present invention may be a broad-area semiconductor laser device (BALD). A broad-area semiconductor laser (BALD) desirable for the present invention is a gain waveguide semiconductor laser that oscillates laser light having a multi-transverse (spatial) mode.

The external cavity semiconductor laser 10 according to the present embodiment is provided with an optical beam-rectifying device that includes a fast axis collimator (FAC) 11 and a slow axis collimator (SAC) 12 for collimating the first laser light 4 and the second laser light 5 both emitted from a semiconductor laser device 1. The FAC 11 and SAC 12 disposed in the optical paths for the first laser light 4 and second laser light 5 can collimate both the first laser light 4 and the second laser light 5.

The external cavity semiconductor laser 10 according to the present embodiment is provided with a piece of reflecting mirror 14 that includes: a first reflecting unit 14a that reflects the first laser light 4 emitted from the first input-output section 2a and returns the reflected light to the first input-output section 2a; and a second reflecting section 14b that reflects the second laser light 5 emitted from the second input-output section 2b and returns the reflected light to the second input-output section 2b. The reflecting mirror 14 disposed in the first laser light 4 and second laser light 5 is further disposed on a line extending from the center axis 3 of the semiconductor laser device 1. The reflecting mirror 14 used here may be a plane mirror since the light incident into the reflecting sections 14a and 14b are collimated by the collimators 11 and 12. The first laser light 4 reflected at the first reflecting unit 14a of the reflecting mirror 14 passes through the SAC 12 and FAC 11 again, and then returns to the first input-output section 2a of the semiconductor laser device 1. Similarly, the second laser light 5 reflected at the second reflecting unit 14b passes through the SAC 12 and FAC 11 again, and further returns to the second input-output section 2b of the semiconductor laser device 1.

A reflection coefficient of the reflecting mirror 14 should preferably be 90% or greater at least at the reflecting sections 14a and 14b.

The external cavity semiconductor laser 10 according to the present embodiment is provided with a reflecting coating 8 provided on a second end surface 7 disposed opposite the first end surface 2 of the semiconductor laser device 1. The reflecting coating 8 provided on the second end surface 7 works as a third reflecting unit that reflects the first laser light 4 and the second laser light 5 returned to the first end surface 2 to emit therefrom. The reflecting coating 8 for use here may be multi-layered dielectric filters or evaporated-metal films. This results in causing most of the first laser light 4 returned to the first input-output section 2a to be reflected by the reflecting coating 8 and emitted from the second input-output section 2b, and causing most of the second laser light 5 returned to the second input-output section 2b to be reflected by the reflecting coating 8 and emitted from the first input-output section 2a. A part of the laser light is sometimes emitted from the input-output section to which the laser light has returned since the laser light is refracted both prior to and subsequent to the reflection at the reflecting coating 8. The reflection coefficient of the reflecting coating 8 is preferably 90% or greater.

This provides a reciprocal path to the optical path in the external cavity where travels through the first input-output section 2a, the reflecting coating 8, and the second input-output section 2b between the first reflecting unit 14a and the second reflecting section 14b. The optical path in the external cavity includes both a part 6a in the first input-output section 2a of the active layer and a part 6b in the second input-output section 2b of the active layer. The external cavity constituted by whole of the active layers 6a and 6b can provide high power output. In addition, the multitime-reciprocated laser light resonated in the optical path of the external cavity can form a stable standing wave. Appropriately adjusting the length of the optical path in the optical path of the external cavity can determine a laser resonant wavelength, thereby enabling to decrease the spectrum width of the output laser light and stably output laser light having superior monochromaticity. The length of optical path of the optical path in the external cavity can be adjusted by adjusting positions and focal lengths of the collimators 11 and 12, and a distance between the semiconductor laser device 1 and the reflecting mirror 14, etc. The length of the optical path in the optical path of the external cavity may be displaced by an integral multiple of ($\lambda$/2) where $\lambda$ indicates the resonant wavelength.

The output laser light can be taken out by providing an output unit for dividing the laser light in two directions at an appropriate position on the optical path of the external cavity. A part of the emitted laser light is reflected onto one of the optical paths for the output lights 4 and 5 in the external cavity semiconductor laser 10 according to the present embodiment. A half mirror 13, provided between the SAC 12 and the reflecting mirror 14, transmits another part of the laser light and reflects laser light, thus an output laser light 9 is taken out. The laser light collimated between the SAC 12 and the reflecting mirror 14 can minimize the affection to the beam shape of the laser light when placing the half mirror 13 on the optical path, thereby taking out the output laser light 9 without a detrimental effect caused by the external cavity to laser light resonance. The reflection coefficient of the half mirror 13 is preferably 4 to 40%.

Figure 3:
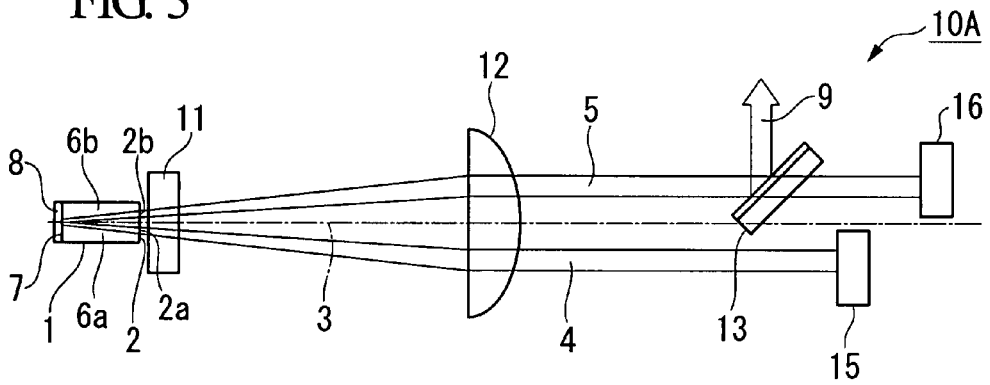
FIG. 3 is a schematic view illustrating a second embodiment of the external cavity semiconductor laser according to the present invention.

Explained next is a second embodiment of the external cavity semiconductor laser according to the present invention. FIG. 3 is a schematic view illustrating an external cavity semiconductor laser 10A according to the present embodiment.

The configuration of the embodiment illustrated in FIG. 3 is the same as that illustrated in FIG. 1 except that the first and second reflecting units disposed separately from each other are reflecting mirrors 15 and 16. Independently adjustable positions of the reflecting mirrors 15 and 16 each relative to the semiconductor laser device 1 facilitate adjusting or changing the length of the optical path of the external cavity laser light. For example, in a possible case where the half mirror 13 placed on the optical path of the second laser light 5 may block the optical path of the first laser light 4, changing the position of the first reflecting mirror 15 for reflecting the first laser light 4 closer to the SAC 12 or the semiconductor laser device 1 than the half mirror 13, and moving the position of the second reflecting mirror 16 away from the semiconductor laser device I will provide a greater space for disposing the half mirror 13 without changing the optical path of the external cavity. The reflection coefficients of the reflecting mirrors 14 and 15 should preferably be 90% or greater at least at the reflecting sections to which the laser light is emitted.

A wavelength-limiting device for limiting the wavelength of the laser light may be provided on the optical path in the external cavity semiconductor laser 10 and 10A of the previous embodiments. It should be noted that the wavelength-limiting device is dispensable in the present invention. A usable example of the wavelength-limiting device is a cut-filter that cuts undesirable wavelengths of light and transmits a resonant wavelength $\lambda$ of light generated by the resonator. Providing the wavelength-limiting device can provide high power light output stable in narrower wavelengths.

Explained next is a third embodiment of the external cavity semiconductor laser according to the present invention.

Figure 4:
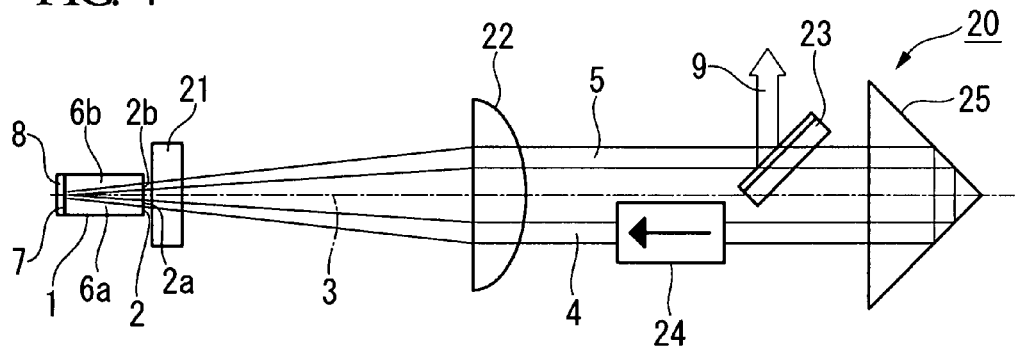
FIG. 4 is a schematic view illustrating a third embodiment of the external cavity semiconductor laser according to the present invention.

FIG. 4 is a schematic view illustrating an external cavity semiconductor laser 20 according to the present embodiment.

The external cavity semiconductor laser 20 is provided with a semiconductor laser device 1. As illustrated in FIG. 2 in enlarged view, the semiconductor laser device 1 used in the present invention is capable of emitting a first laser light 4 and a second laser light 5 in two directions from a common end surface 2 (this surface is sometimes called a first end surface). Disposed on the first end surface 2 is a center axis 3 positioned between a first input-output section 2a for emitting the first laser light 4 and a second input-output section 2b for emitting the second laser light 5. A gain waveguide semiconductor laser can be named for a specific example of the laser device. The active layer for laser of a gain waveguide semiconductor laser has a width range of, 50 µM to 400 µm along the interface between a p-type semiconductor and a n-type semiconductor cemented together. Since a gain waveguide semiconductor laser has a property that bends emitted laser light in two directions, higher refractive indexes at both ends of the active layer based on an increase in driving current cause the active layer itself to work as a concave lens.

An example of a semiconductor laser device 1 adaptable for the present invention may be a broad-area semiconductor laser device (BALD). A broad-area semiconductor laser (BALD) desirable for the present invention is a gain waveguide semiconductor laser that oscillates laser light having a multi-mode in a traverse (spatial) mode.

The external cavity semiconductor laser 20 according to the present embodiment is provided with an optical beam-rectifying device that includes a fast axis collimator (FAC) 21 and a slow axis collimator (SAC) 22 for collimating the first laser light 4 and the second laser light 5 both emitted from the semiconductor laser device 1. The FAC 21 and SAC 22, since they are disposed in the optical paths for the first laser light 4 and the second laser light 5, can collimate both the first laser light 4 and the second laser light 5.

The external cavity semiconductor laser 20 of the present embodiment is provided with an optical path-changing unit that changes the optical path of the second laser light 5 emitted from the second input-output section 2b and returns to the first input-output section 2a. Also provided is a unidirectional transmission unit that transmits (transfers) the laser light emitted from the second input-output section 2b and returning to the first input-output section 2a while blocking the laser light emitted from the first input-output section 2a.

The unidirectional transmission unit is a unit designed to transmit light in a specific direction (forward direction) and to block light in the direction (reverse direction) opposite the specific direction. The unidirectional transmission unit used in the present embodiment is an optical isolator 24 disposed on the optical path of the first laser light 4. The optical isolator 24 is disposed so that an incident end surface is disposed toward the optical path-changing unit (prism 25, i.e., toward the right-hand side in the drawing), and an output end surface is disposed toward the semiconductor laser device 1 (left-hand side in the drawing). Also, the optical path-changing unit in the present embodiment is a piece of prism 25 disposed on a line extending from the center axis 3 of the semiconductor laser device 1. Therefore, the optical path of the second laser light 5 emitted from the second input-output section 2b is changed by the prism 25. Subsequently the changed laser light 5 passes the isolator 24 followed by the SAC 22 and FAC 22 again, and returns, i.e., incident to the first input-output section 2a of the semiconductor laser device 1.

The external cavity semiconductor laser 20 according to the present embodiment is provided with a reflecting coating 8 provided on a second end surface 7 disposed opposite the first end surface 2 of the semiconductor laser device 1. The reflecting coating 8 provided on the second end surface 7 works as a reflecting unit that reflects the laser light returning to the first end surface 2 and emitting from the first end surface 2. The reflecting coating 8 for use here may be multi-layered dielectric filters or evaporated-metal films. Most of the first laser light 4 is emitted from the second input-output section 2b because most returning to the first input-output section 2a is reflected by the reflecting coating 8. A part of the laser light refracted, prior to and subsequent to the reflections at the reflecting coating 8, that is in the semiconductor laser device 1, may sometimes be emitted from the first input-output section 2a to which the part of the laser light returns. However, since the output light 4 emitted from the first input-output section 2a is blocked by the isolator 24, the output light 4 does not impair the characteristics of the external cavity.

This provides a loop-shaped optical path to the external cavity in which the laser light travels through the second input-output section 2b, the prism 25, the first input-output section 2a, and the reflecting coating 8 near the second end surface 7 in this order.

The optical path in the external cavity includes both a part 6a in the first input-output section 2a of the active layer and a part 6b in the second input-output section 2b of the active layer. The external cavity constituted by whole of the active layers 6a and 6b can provide high power output. In addition, the loop-shaped external cavity optical path providing multi-loop resonation to the laser light can form a stable standing wave. Appropriately adjusting the length of the optical path in the optical path of the external cavity capable of determining a laser resonant wavelength can decrease the spectrum width of the output laser light, thereby stably outputting laser light having superior monochromaticity. The length of the optical path of the optical path in the external cavity can be adjusted by adjusting positions and focal lengths of the collimators 21 and 22, and a distance between the semiconductor laser device 1 and the prism 25, etc. The reflection coefficient of the reflecting coating 8 is preferably 90% or greater.

The output laser light can be taken out by providing an output unit for dividing the laser light in two directions at an appropriate position on the optical path of the external cavity. A part of the emitted laser light emitted from the second input-output section 2b is reflected onto the optical path of the second laser light 5 in the external cavity semiconductor laser 20 according to the present embodiment. Thus the half mirror 23, provided between the SAC 22 and the prism 25, transmits another part of the laser light and reflects laser light; thus output laser light 9 is taken out. The laser light collimated between the SAC 22 and the prism 25 can minimize the affection to the beam shape of the laser light when placing the half mirror 23 on the optical path, thereby taking out the output laser light 9 without a detrimental effect caused by the external cavity to laser light resonance. The reflection coefficient of the half mirror 23 is preferably 4 to 40%.

Figure 5:
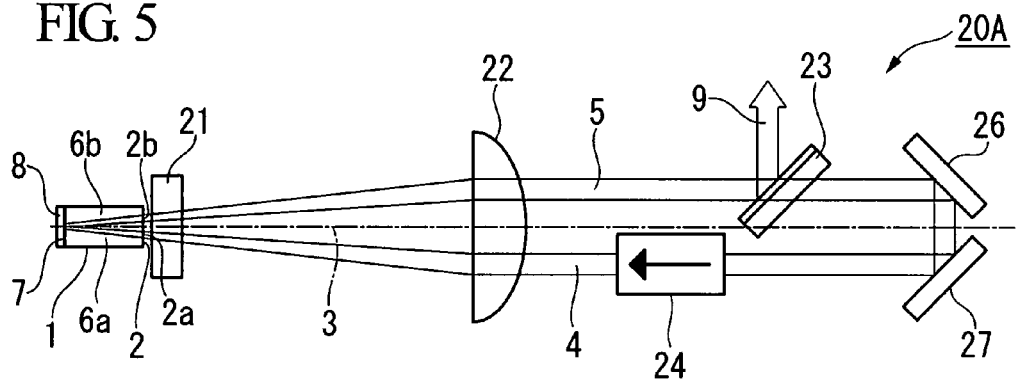
FIG. 5 is a schematic view illustrating a fourth embodiment of the external cavity semiconductor laser according to the present invention.

Explained next is a fourth embodiment of the external cavity semiconductor laser according to the present invention. FIG. 5 is a schematic view illustrating an external cavity semiconductor laser 20A according to the present embodiment.

The configuration of the embodiment illustrated in FIG. 5 is the same as that illustrated in FIG. 4 except that is provided with two pieces of reflecting mirrors 26 and 27 directed into different directions from each other. The reflecting mirrors 26 and 27 each act as an optical path-changing unit for changing the second laser light 5 emitted from the second input-output section 2b and returning the changed laser light 5 to the first input-output section 2a. Independently adjustable positions of the reflecting mirrors 27 and 16 each relative to the semiconductor laser device 1 and separately adjustable directions of the reflecting surfaces facilitate adjusting or changing the length of the optical path of the external cavity laser light.

The number of the reflecting mirrors forming the optical path-changing unit is not limited to 2 pieces. More than three pieces of reflecting mirrors may be used. The reflection coefficients of the reflecting mirrors 26 and 27 should preferably be 90% or greater at least at the reflecting sections to which the laser light is emitted.

Figure 6:
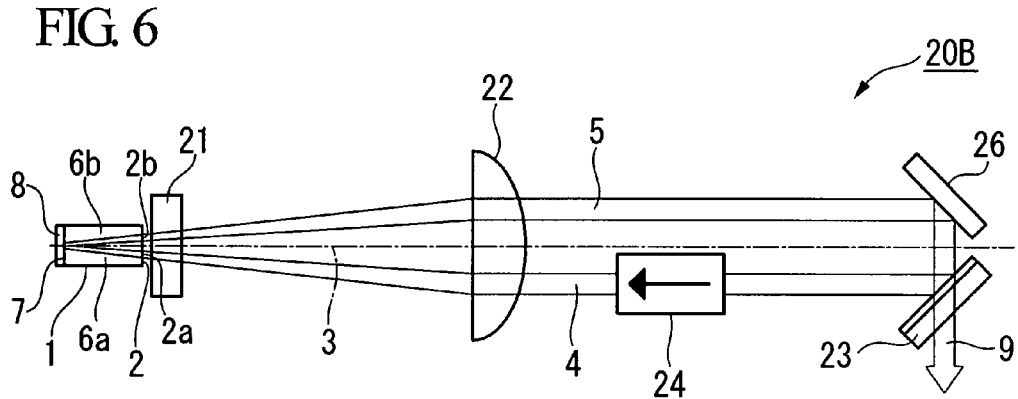
FIG. 6 is a schematic view illustrating a fifth embodiment of the external cavity semiconductor laser according to the present invention.

Explained next is a fifth embodiment of the external cavity semiconductor laser according to the present invention. FIG. 6 is a schematic view illustrating an external cavity semiconductor laser 20B according to the present embodiment.

The configuration of the embodiment illustrated in FIG. 6 is the same as that illustrated in FIG. 5 except that one of the two reflecting mirrors 26 and 23 forming the optical path-changing unit is the half mirror 23 compatibly working as the output unit for taking out the output laser light.

A wavelength-limiting device for limiting the wavelength of the laser light may be provided on the optical path in the external cavity semiconductor laser 20, 20a, and 20B of the previous embodiments. The device is dispensable in the present invention. A usable example of the wavelength-limiting device is a cut-filter that cuts undesirable wavelengths of light and transmits a resonant wavelength λ of light generated by the resonator. Providing the wavelength-limiting device can obtain high power light output stable in narrower wavelengths.

Figure 7:
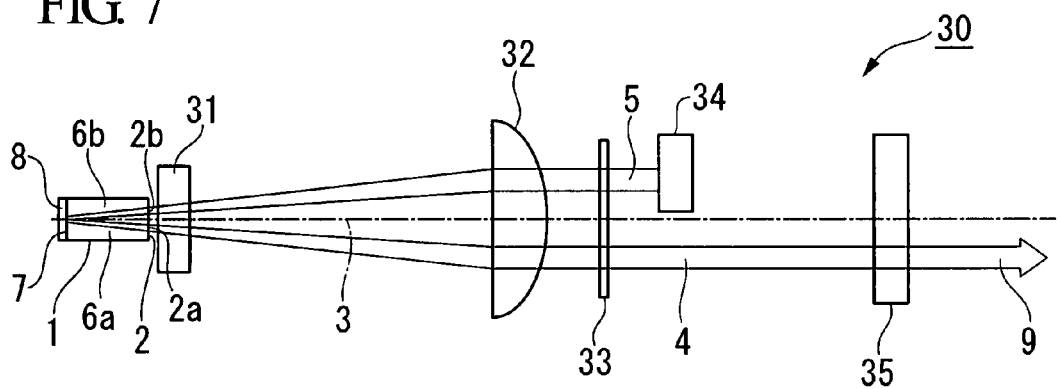
FIG. 7 is a schematic view illustrating a sixth embodiment of the external cavity semiconductor laser according to the present invention.

Explained next is a sixth embodiment of the external cavity semiconductor laser according to the present invention. FIG. 7 is a schematic view illustrating an external cavity semiconductor laser 30 according to the present embodiment.

The external cavity semiconductor laser 20 is provided with a semiconductor laser device 1. As illustrated in FIG. 2 in enlarged view, the semiconductor laser device 1 used in the present invention is capable of emitting a first laser light 4 and a second laser light 5 in two directions from a common end surface 2 (this surface is sometimes called a first end surface). Disposed on the first end surface 2 is a center axis 3 positioned between a first input-output section 2a for emitting the first laser light 4 and a second input-output section 2b for emitting the second laser light 5. A gain waveguide semiconductor laser can be named for a specific example of the laser device. The active layer for laser of a gain waveguide semiconductor laser has a width range of, 50 μm to 400 μm along the interface between a p-type semiconductor and a n-type semiconductor cemented together. Since a gain waveguide semiconductor laser has a property that bends emitted laser light in two directions, higher refractive indexes at both ends of the active layer based on an increase in driving current cause the active layer itself to work as a concave lens.

An example of a semiconductor laser device 1 adaptable for the present invention may be a broad-area semiconductor laser device (BALD). A broad-area semiconductor laser (BALD) desirable for the present invention is a gain waveguide semiconductor laser that oscillates laser light having a multi-mode in a traverse (spatial) mode.

The external cavity semiconductor laser 30 according to the present embodiment is provided with an optical beam-rectifying device that includes a fast axis collimator (FAC) 31 and a slow axis collimator (SAC) 32 for collimating the first laser light 4 and the second laser light 5 both emitted from a semiconductor laser device 1. The FAC 31 and SAC 32 disposed in the optical paths for the first laser light 4 and the second laser light 5 can collimate both first laser light 4 and second laser light 5. Cylindrical lenses are examples that can be used for FAC 31 and SAC.

The external cavity semiconductor laser 30 according to the present embodiment is provided with: a half mirror 35 working as the first reflecting unit that reflects the first laser light 4 emitted from the first input-output section 2a and returns the reflected light to the first input-output section 2a; and a reflecting mirror 34 working as the second reflecting unit that reflects the second laser light 5 emitted from the second input-output section 2b and returns the reflected light to the second input-output section 2b. The reflecting mirror 34 and the half mirror 35 can be plane mirrors because the light incident into the reflecting mirror 34 and the half mirror 35 are collimated by the collimators 31 and 32. The first output light 4 reflected by the half mirror 35 passes through the SAC 12 and the FAC 31 again and returns to the first input-output section 2a of the semiconductor laser device 1. Similarly, the second output light 5 reflected by the reflecting mirror 34 passes through the SAC 32 and the FAC 31 again and returns to the second input-output section 2b of the semiconductor laser device 1.

The reflection coefficient of the reflecting mirror 34 is preferably 90% or greater. Also, the reflection coefficient of the half mirror 35 is preferably 4 to 40%.

The light having transmitted through the half mirror 35 becomes an output laser light 9 of the external cavity semiconductor laser 30. That is, in the present embodiment, the output unit outputting the output laser light 9 that is a part of the laser light is disposed to the half mirror 35 compatibly working as the first reflecting unit for the laser light. This enables taking out of the output laser light 9 without affecting the resonation of the laser light in the external cavity optical path.

In addition, the external cavity semiconductor laser 30 according to the present embodiment is provided with a reflecting coating 8 provided on a second end surface 7 disposed opposite the first end surface 2 of the semiconductor laser device 1. The reflecting coating 8 provided on the second end surface 7 works as a third reflecting unit that reflects the first laser light 4 and the second laser light 5 returned to the first end surface 2 to emit therefrom. The reflecting coating 8 for use here may be multi-layered dielectric filters or evaporated-metal films. This results in causing most of the first laser light 4 returned to the first input-output section 2a to be reflected by the reflecting coating 8 and emitted from the second input-output section 2b and causing most of the laser light 5 returned to the second input-output section 2b to be reflected by the reflecting coating 8 and emitted from the first input-output section 2a. A part of the laser light is sometimes emitted from the input-output section to which the laser light has returned since the laser light is refracted both prior to and subsequent to the reflection at the reflecting coating 8. The reflection coefficient of the reflecting coating 8 is preferably 90% or greater.

This provides a reciprocal path to the optical path in the external cavity where travels through the first input-output section 2a, the reflecting coating 8, and the second input-output section 2b between the half mirror 35 and the reflecting mirror 34. The optical path in the external cavity includes both a part 6a in the first input-output section 2a of the active layer and a part 6b in the second input-output section 2b of the active layer. The external cavity constituted by whole of the active layers 6a and 6b can provide high power output. In addition, the multitime-reciprocated laser light resonated in the optical path of the external cavity can form a stable standing wave. Appropriately adjusting the length of the optical path in the optical path of the external cavity capable of determining a laser resonant wavelength enables decreasing the spectrum width of the output laser light, thereby stably outputting laser light having superior monochromaticity. The length of the optical path of the optical path in the external cavity can be adjusted by adjusting positions and focal lengths of the collimators 31 and 32, a distance between the semiconductor laser device 1 and the first reflecting unit 34, and a distance between the semiconductor laser device 1 and the second reflecting unit 35, etc.

In the conventional example (see FIG. 9), the mode of output to be amplified by the resonator is limited based on the relationship between the reflecting mirror 53 and the output mode of the semiconductor laser device 1. In contrast, the mode of output to be amplified by the resonator is limited based on the relationship between the reflecting mirror 34 and the half mirror 35 in the external cavity semiconductor laser 30 of the present embodiment. This provides a stable resonated output mode against disturbance, e.g., change in temperature, and external stress. The length of the optical path adjustable in the reflecting mirror 34 or the half mirror 35 can provide optimum adjustment for the correlation between both components. Thus, the light-condensing position of the output laser light 9 of the external cavity semiconductor laser 30 can be adjusted stably in sub-micron or smaller.

A wavelength-limiting device 33 for limiting the wavelength of the first laser light 4 and second laser light 5 may be provided to the external cavity semiconductor laser 30 of the present embodiment. It should be noted that the wavelength-limiting device 30 is a dispensable component in the present invention. FIG. 7 shows an example of the wavelength-limiting device 33 disposed on the first laser light 4 and the second laser light 5 between the first reflecting unit 34 and the second reflecting unit 35 and the SAC 12. It should be noted that the present invention is not limited to the configuration or arrangement thereof. A usable example of the wavelength-limiting device 33 is a cut-filter that cuts undesirable wavelengths of light and transmits a resonant wavelength λ of light generated by the resonator.

A resonation optical path in the present embodiment indicated by reference numerals 33-32-31-1-31-32-33-35 including both the optical path of the first laser light 4 and the optical path of the second laser light 5 passes through the wavelength-limiting device 33. More passages by the resonation optical path through the wavelength-limiting device 33 provide high power output light stable in a narrower bandwidth of wavelength.

The present invention is not limited to the previously-explained preferable embodiments, and it should be noted that the configuration of the present invention allows for various modifications without departing from the spirit and scope of the present invention.

The reflecting unit is not limited to a reflecting mirror including a plane mirror or a curved mirror, and a reflection device having wavelength selectivity, e.g., a grating or an etalon can be used. Accordingly, wavelength selectivity provided to the reflecting unit can decrease the spectrum width of the output laser light.

A reflecting mirror usable as a reflecting unit or a circuit-switching unit may be a partially-reflective mirror having a mirrored-finish reflecting surface in a region to which external cavity laser light is emitted. This case can simplify the mirrored-finish work conducted to the reflecting surface. Adjusting further the shape of the region for forming the reflecting surface can adjust the shape of the beam. Forming a light-absorbing coating or an anti-reflection coating on the periphery of the reflecting surface in this case provides more effective adjustment to the shape of the beam.

Further forming a filter layer that reflects only a specific wavelength of light on the reflecting surface of the reflecting mirror provides wavelength selectivity, thereby enabling decreasing of the spectrum width of the output laser light.

Also, a wavelength-limiting device for limiting the wavelength of laser light can be disposed in any embodiment of the external cavity semiconductor laser, if necessary. A usable example of the wavelength-limiting device is a cut-filter that cuts undesirable wavelengths of light and transmits a resonant wavelength x of light generated by the resonator. Providing the wavelength-limiting device can obtain high power light output stable in narrower wavelengths.

EXAMPLES

Figure 9:
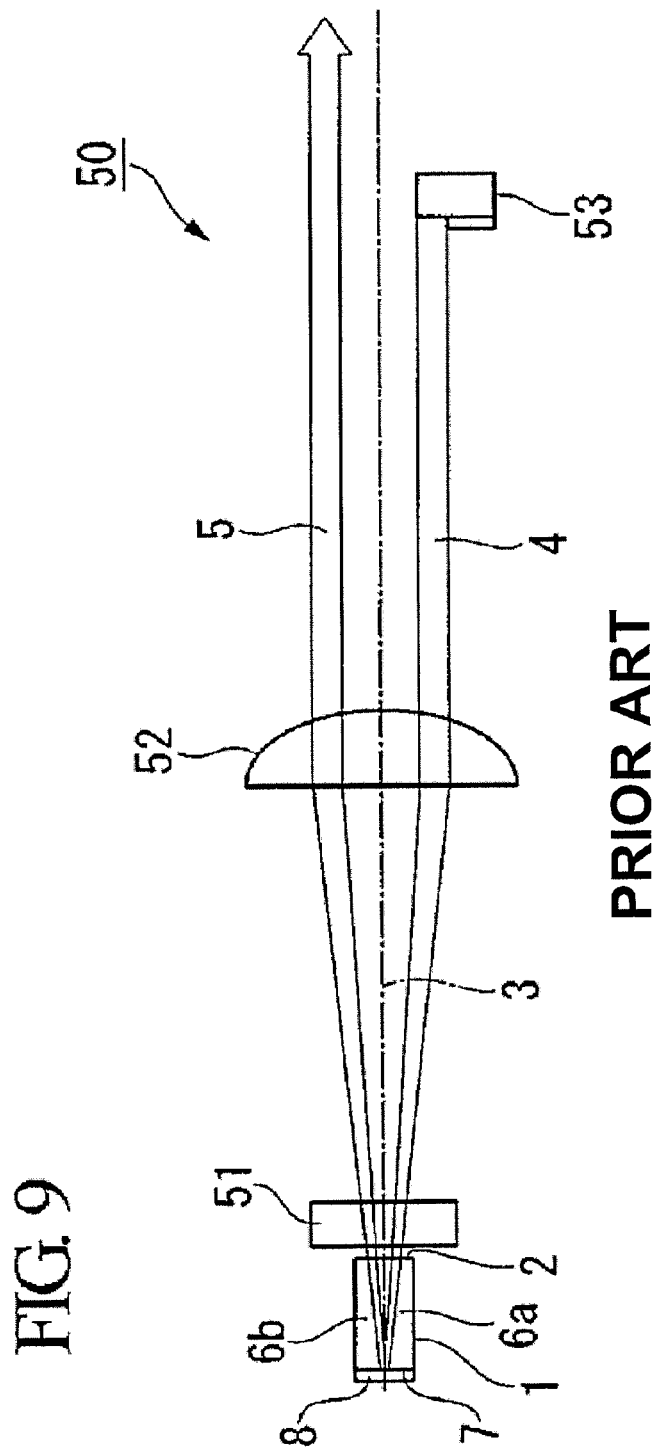
FIG. 9 is a schematic view illustrating an example of the conventional external cavity semiconductor laser.

An external cavity semiconductor laser 30 (embodiment) of two-side-resonation type as illustrated in FIG. 7 and an external cavity semiconductor laser 50 (comparative example) of one-side-resonation type as illustrated in FIG. 9 are formed. Used here for a gain waveguide semiconductor laser is EYP-BAE-1120 (product name of Eagleyard Photonics, Germany). Used for collimators are an FAC having a focal distance of 0.9 mm and an SAC having a focal distance of 30 mm. Laser is resonated and output by driving the semiconductor laser having position-adjusted optical components under equal conditions between the example and the comparative example.

Reflection coefficients are set to satisfy the relationship $R3<R1<R2$ where R1 indicates a reflection coefficient of the reflecting coating 8 of the semiconductor laser device 1, R2 indicates a reflection coefficient of the reflecting mirror 34, and R3 indicates a reflection coefficient of the half mirror 35. Observing the output laser light with a powermeter LM3 (product name, Coherent Inc.) resulted in a relationship between driving current (unit: A) and output (unit: W) as shown in FIG. 8.

Furthermore, effects on the reflection coefficient of the half mirror 35 in the external cavity semiconductor laser 30 of two-side-resonation type were examined by using three half mirrors 35 corresponding to three different reflection coefficients of R3, R3', and R3".

Figure 8:
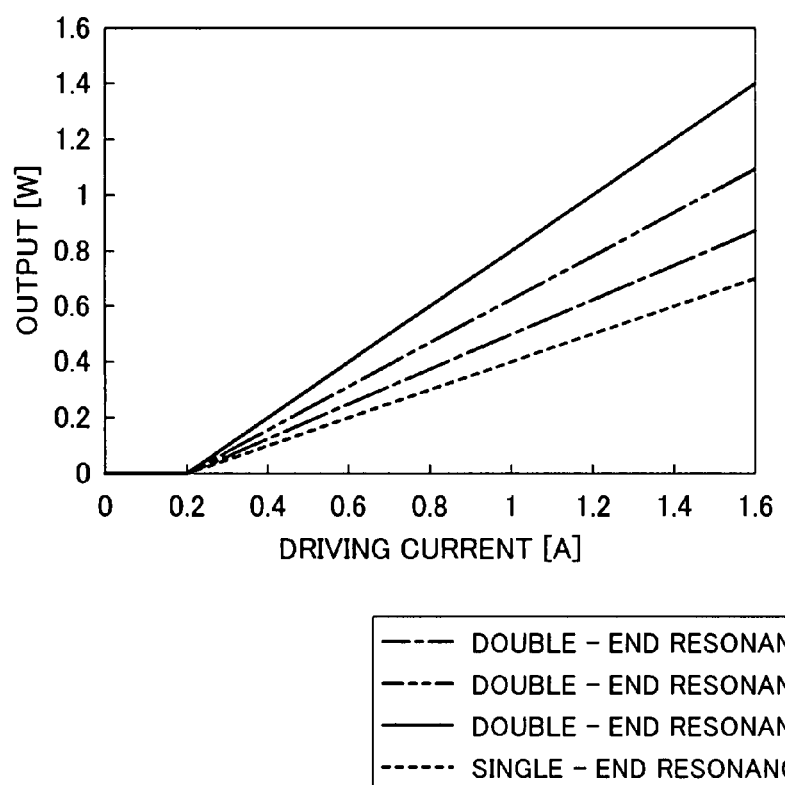
FIG. 8 is a graph describing examples of output characteristics with respect to the external cavity semiconductor laser according to the present invention and a conventional external cavity semiconductor laser.

The external cavity semiconductor laser used in the example exhibited output higher than that of the external cavity semiconductor laser in the comparative example as shown in FIG. 8. The external cavity semiconductor laser of the comparative example uses only half of the active layer of the semiconductor laser device. In contrast, the external cavity semiconductor laser according to the embodiment constituting the external cavity of the example uses the entire active layer of the semiconductor laser device. Therefore, the embodiment external cavity semiconductor laser provides output higher comparative example based on driving current I commonly, thereby possibly doubling the output P based on the a reflection coefficient $R_3$ of the half mirror 35.

Output testing carried out for the external cavity semiconductor laser 10 as shown in FIG. 1 and the external cavity semiconductor laser 20 as shown in FIG. 4 based on the same condition as previously explained resulted in obtaining output as high as that of the external cavity semiconductor laser 30 (example) as shown in FIG. 7.

Explained next is a seventh embodiment of the external cavity semiconductor laser according to the present invention.

Figure 10:
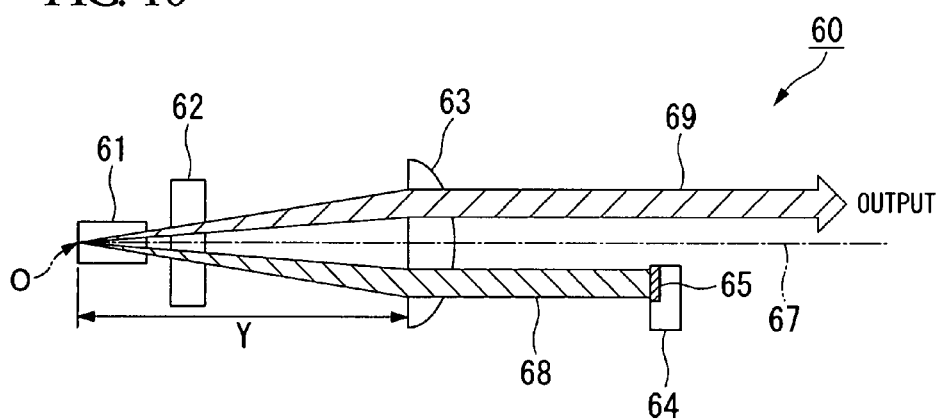
FIG. 10 is a schematic view illustrating a seventh embodiment of the external cavity semiconductor laser according to the present invention viewing the external cavity semiconductor laser in a vertical direction.
Figure 11:
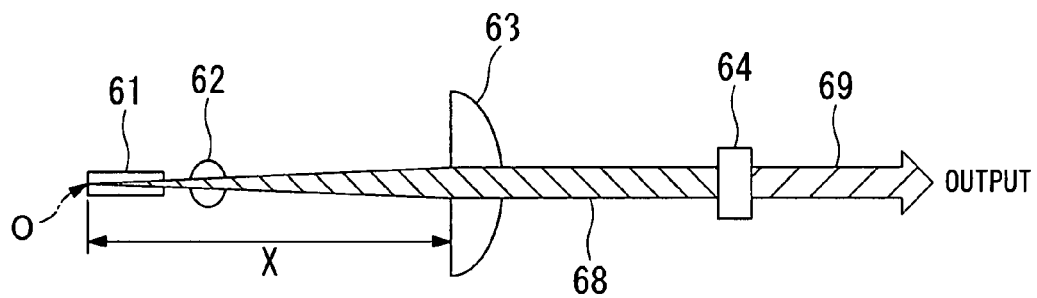
FIG. 11 shows the external cavity semiconductor laser of FIG. 10 viewed in a horizontal direction.

FIGS. 10 and 11 are schematic views illustrating the external cavity semiconductor laser according to the present invention. FIG. 10 shows viewed in a first direction (hereinafter called a "vertical direction") orthogonal to a surface including the optical axes of laser light emitted from the semiconductor laser in two directions. FIG. 11 shows a direction of center axis dividing the optical axes of the laser light emitted from the semiconductor laser in two directions, and a direction orthogonal to the first direction where both directions are viewed in a second direction (hereinafter called "horizontal direction").

As illustrated in FIGS. 10 and 11, an external cavity semiconductor laser 60 of the present embodiment is provided with a semiconductor laser device 61, an optical beam-rectifying device (first laser spreading angle-adjusting section) 62, an optical beam-rectifying device (second laser spreading angle-adjusting section) 63, and a reflecting unit 64. The optical beam-rectifying devices 62 and 63 are disposed in the optical paths of the external cavity laser light 68 and output laser light 69.

The semiconductor laser device 61 emits laser light in at least two directions from a common end surface. An example usable in the present invention is a gain waveguide semiconductor laser. The active layer for laser of a gain waveguide semiconductor laser has a width range of 50 μm to 400 μm along the interface between a p-type semiconductor and a n-type semiconductor cemented together. Since a gain waveguide semiconductor laser has a property that bends emitted laser light in two directions, higher refractive indexes at both ends of the active layer based on an increase in driving current causes the active layer itself to work as a concave lens.

Laser lights 68 and 69 emitted from the semiconductor laser device 61 in two directions pass through the optical beam-rectifying devices 62 and 63, and are collimated to parallel beams along the center axis 67. On the other hand, the pumping laser light 68 for the semiconductor laser device 61 is an external cavity laser light. The collimated laser light 68 reflected by the reflecting unit 64 passes through the optical beam-rectifying devices 62 and 63 again and returns to the semiconductor laser device 61. The other output laser light 69 passing through the optical beam-rectifying devices 62 and 63 is output externally.

The optical beam-rectifying device 62 condenses the laser lights 68 and 69 into the first direction (the direction orthogonal to the page of FIG. 10) orthogonal to a surface including the optical axes of the laser lights 68 and 69 emitted from the semiconductor laser device 61 in two ways. The optical beam-rectifying device condenses the laser lights 68 and 69 into the first direction and the second direction where the direction of the center axis 67 divides the optical axes of the laser lights 68 and 69 emitted from the semiconductor laser device 61 in two directions, and the second direction indicates the direction orthogonal to the first direction (the direction orthogonal to the page of FIG. 11). For example, the optical beam-rectifying device 62 can be a fast axis collimator (hereinafter sometimes called an "FAC") constituted by a cylindrical lens, and the optical beam-rectifying device can be a slow axis collimator (hereinafter sometimes called an "SAC") constituted by a spherical lens. This allows the external cavity laser light 68 and the output laser light 69 to be effectively collimated in a common optical system.

The reflecting unit 64 may be a reflecting mirror. The reflecting mirror for use here should preferably be a partially-reflective mirror having a curved reflecting surface 65 formed in only a region onto which the external cavity laser light 68 is illuminated. Also, adjusting the shape of the region for forming the reflecting surface can adjust the shape of the beam. The region forming may be adjusted by cutting a non-reflective region by using a dicing. Forming a light-absorbing coating or an anti-reflection coating on the region except for the reflecting surface 65 provides more effective adjustment to the shape of the beam.

Figure 12:
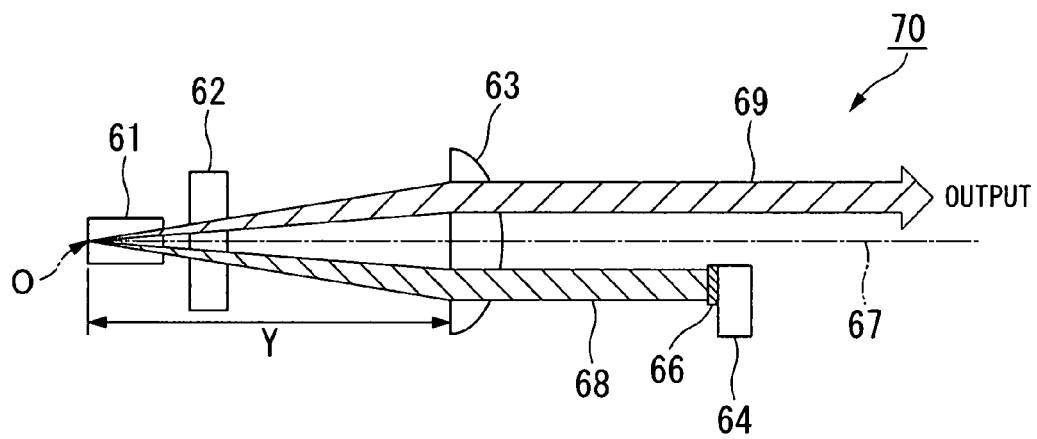
FIG. 12 is a schematic view illustrating an eighth embodiment of the external cavity semiconductor laser according to the present invention.

FIG. 12 shows an eighth embodiment of the external cavity semiconductor laser according to the present invention. A filter layer 66 for reflecting only a specific wavelength of light may be formed on the reflecting surface of the external cavity laser light 68 in a reflecting unit 64 of the external cavity semiconductor laser 70 according to the present embodiment. This can enhance wavelength selectivity and decrease the spectrum width of the output laser light 69.

The above configured external cavity semiconductor laser can coincide the beam shape in the resonator in both the vertical direction and the horizontal direction. Accordingly, the spreading angles of the beams output from the resonator in two directions coincide, thus anastigmatism can be eliminated.

EXAMPLES

The cross sectional shape of the output laser light 69 collimated by the optical beam-rectifying devices 62 and 63 as shown in FIG. 11 were observed at a predetermined position to examine the adjustment of the spreading angles of the laser light in the external cavity semiconductor laser of the present invention so that the beam shape in the resonator coincide or come closer infinitely in both the horizontal direction and the vertical direction.

The external cavity semiconductor laser 60 shown in FIG. 11 is provided with a semiconductor laser device 61, an FAC (fast axis collimator) 62, an SAC (slow axis collimator) 63, and a reflecting unit 64. The semiconductor laser device 61 is a gain waveguide semiconductor laser produced by Eagleyard Photonics (Eagleyard Photonics). FAC 62 is a cylindrical lens (a piece of optical fiber) having a diameter of 125 μm, a refractive index 1.45, and a focal distance of 0.08 mm. SAC 63 is an axi-symmetric aspherical lens having a focal distance of 20 mm. The reflecting unit 64 is a 3 mm×3 mm mirror-surface-finished reflecting mirror.

Figure 13:
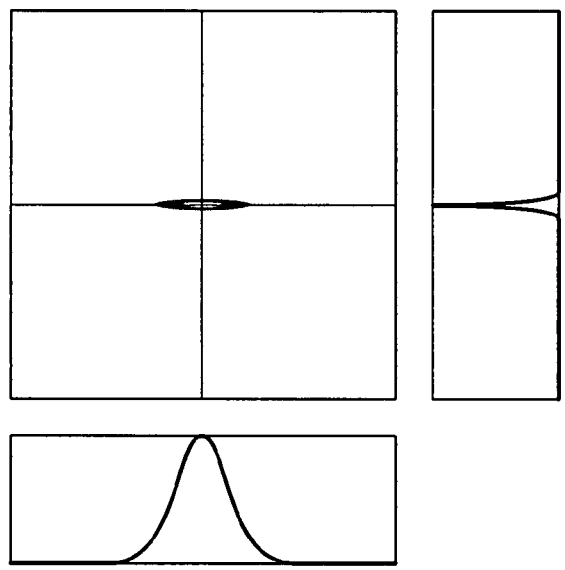
FIG. 13 is a cross sectional view of laser light at a reference point O.
Figure 14:
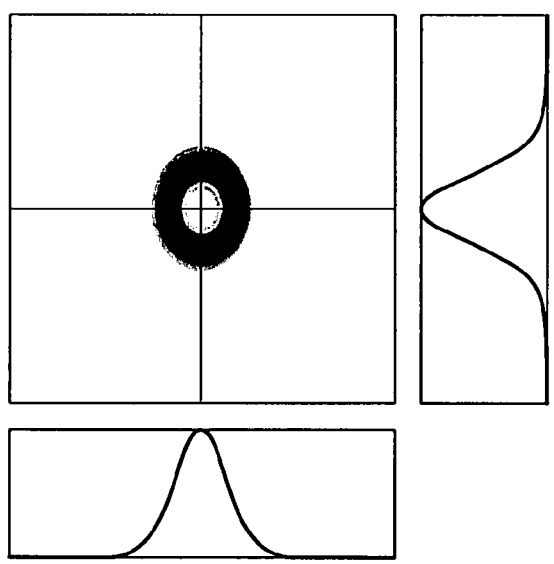
FIG. 14 is a cross sectional view of laser light at a point A of the external cavity semiconductor laser according to the present invention.
Figure 15:
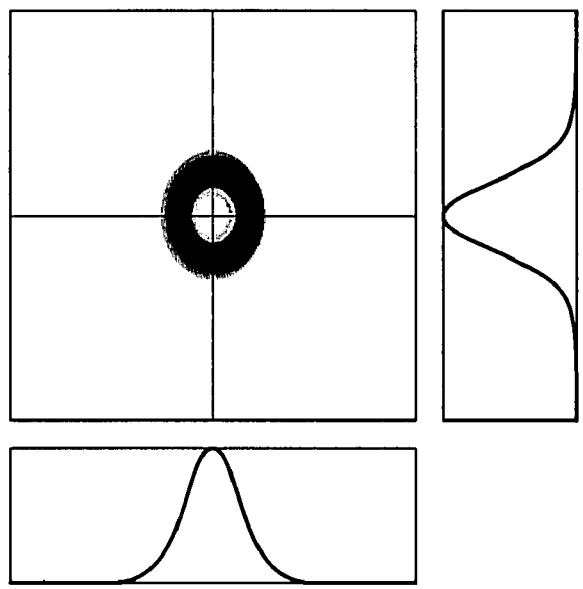
FIG. 15 is a cross sectional view of laser light at a point B of the external cavity semiconductor laser according to the present invention.
Figure 16:
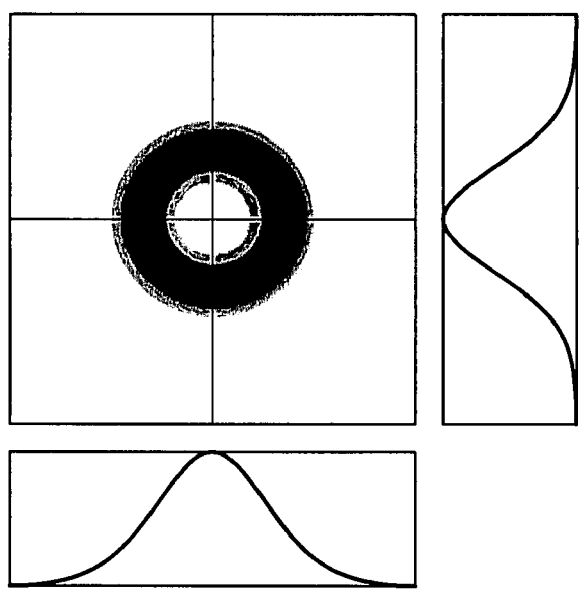
FIG. 16 is a cross sectional view of laser light at a point C of the external cavity semiconductor laser according to the present invention.
Figure 17:
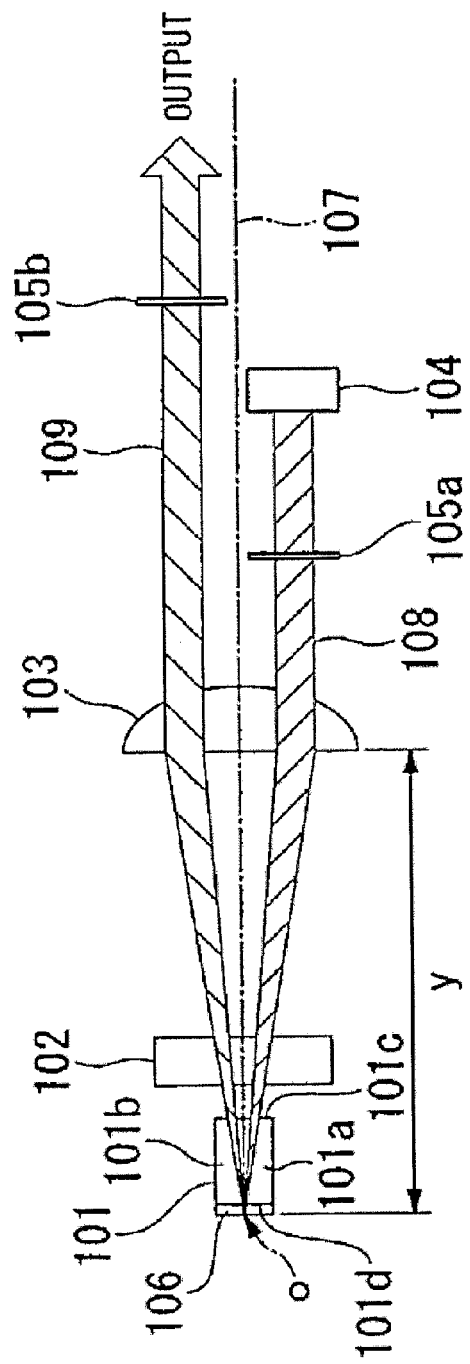
FIG. 17 is a schematic view illustrating an example of a conventional external cavity semiconductor laser.
Figure 18:
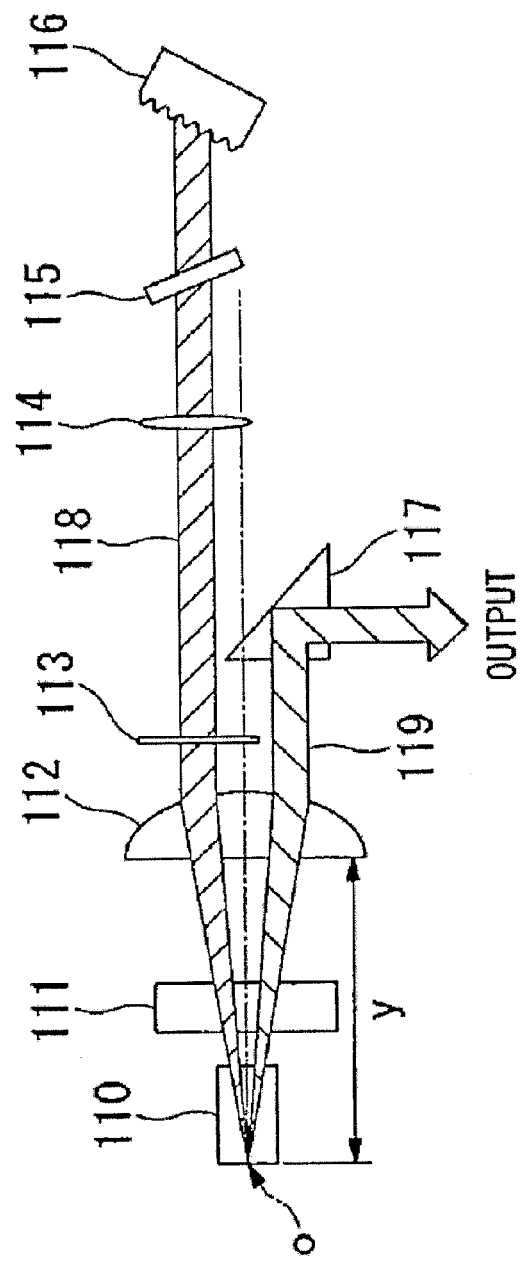
FIG. 18 is a schematic view illustrating another example of a conventional external cavity semiconductor laser.
Figure 19:
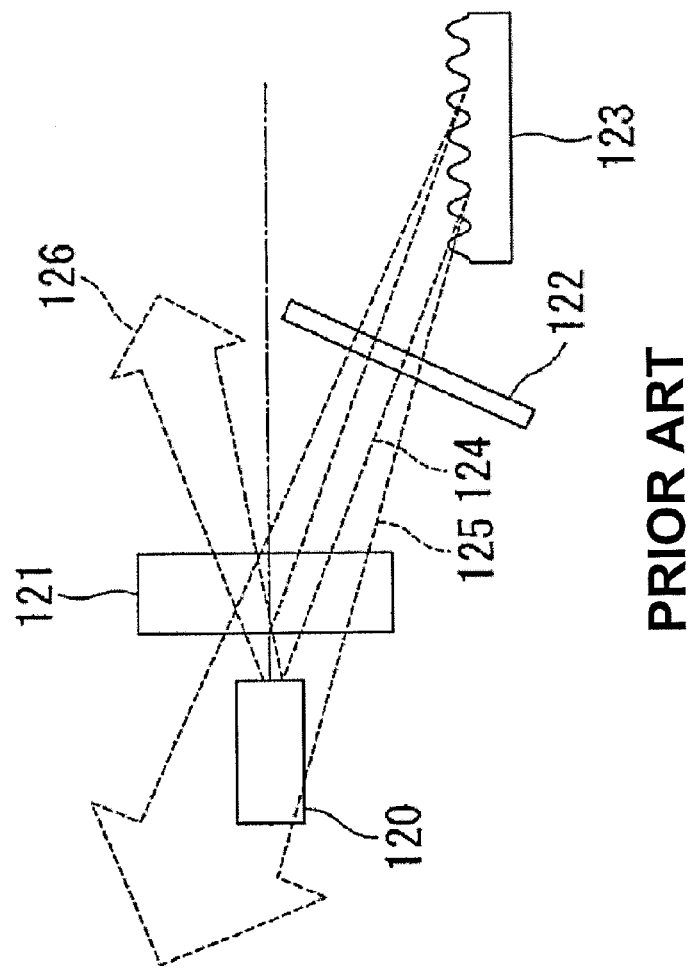
FIG. 19 is a schematic view illustrating another example of a conventional external cavity semiconductor laser.

The cross sectional shape of the output laser light 69 at the predetermined position is obtained with a beam-profile analyzer manufactured by OPHIR Optromics Ltd. while driving the external cavity semiconductor laser 60 at 350 mW (1.21 V of driving voltage and 800 mA of driving current). The predetermined positions for observing the cross sectional shape of the output laser light 69 are: point A that is 50 mm from an origin O where the origin O indicates a rear surface (the left-most surface in the drawing) of the semiconductor laser device 61; point B that is 200 mm from the reference point O; and point C that is 500 mm from the reference point O. FIGS. 13 to 16 show the results. FIG. 13 shows the cross sectional shape of the output laser light at the reference point O. FIG. 14 shows the cross sectional shape at the point A that is 50 mm from the reference point O. FIG. 15 shows the cross sectional shape at the point B that is 200 mm from the reference point O. FIG. 16 shows the cross sectional shape at the point C that is 500 mm from the reference point O. FIGS. 14 to 16 are described in 10× scale with respect to FIG. 13.

Figure 20:
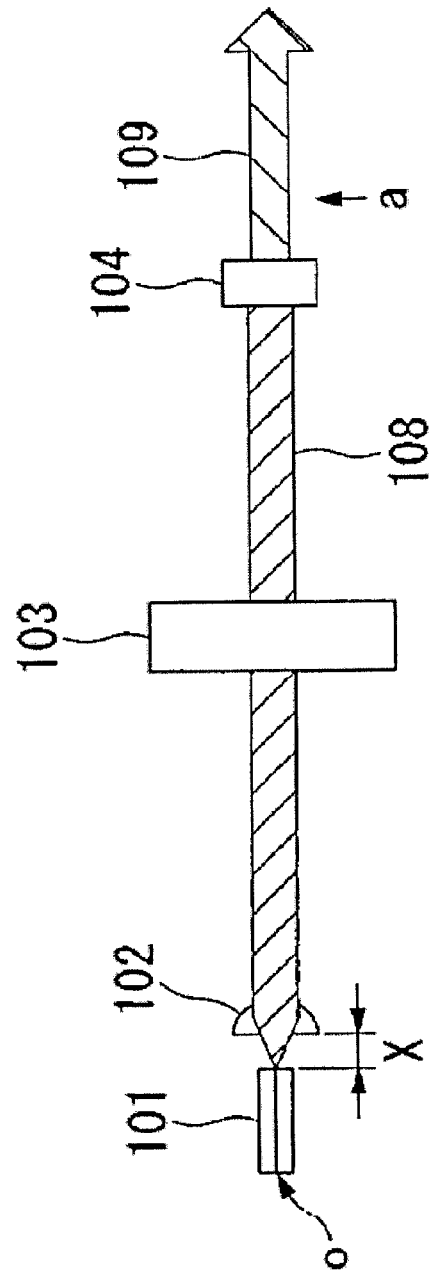
FIG. 20 shows the external cavity semiconductor laser of FIG. 17 viewed in a horizontal direction.
Figure 21:
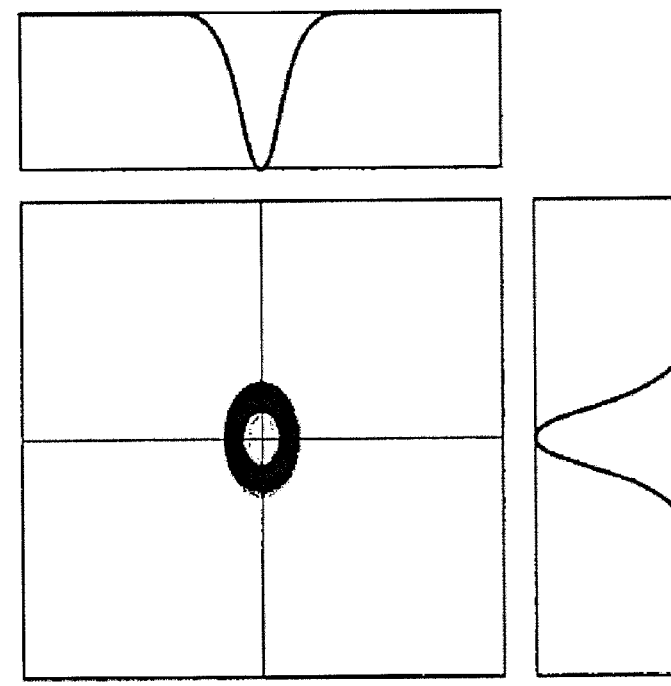
FIG. 21 is a cross sectional view of laser light at a point a of the external cavity semiconductor laser according to the present invention.
Figure 22:
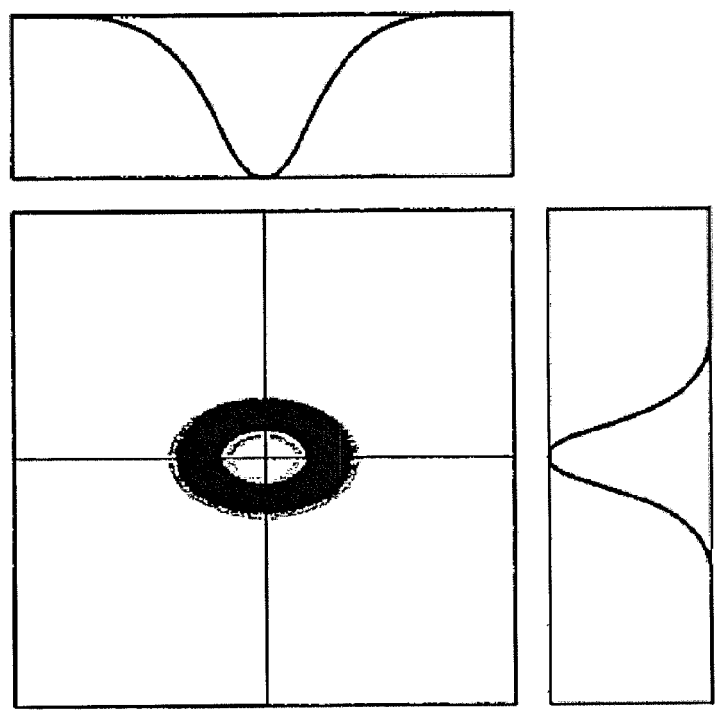
FIG. 22 is a cross sectional view of laser light at a point b of the external cavity semiconductor laser according to the present invention.
Figure 23:
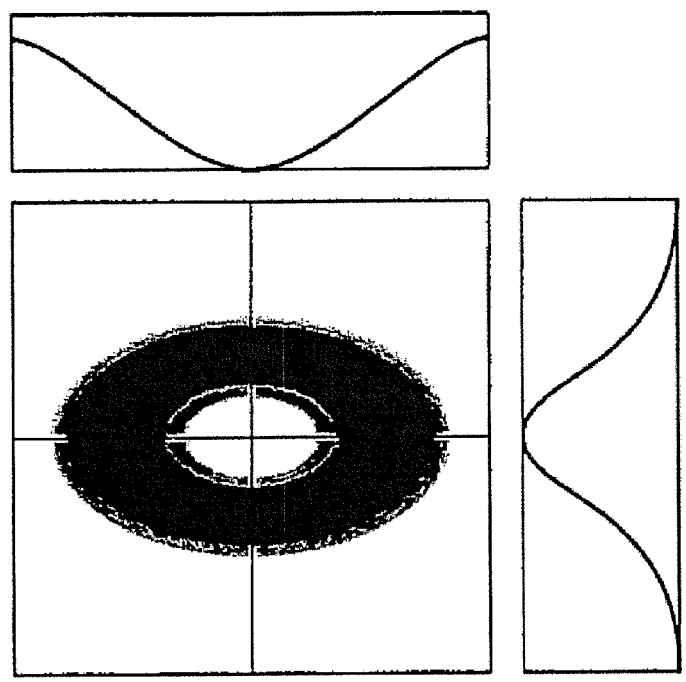
FIG. 23 is a cross sectional view of laser light at a point c of the external cavity semiconductor laser according to the present invention.

A prepared comparative example is a conventional external cavity semiconductor laser as illustrated in FIG. 20. The external cavity semiconductor laser is provided with a semiconductor laser device 101, an FAC (fast axis collimator) 102, an SAC (slow axis collimator) 103, and a reflecting unit 104. The semiconductor laser device 101 is a gain waveguide semiconductor laser produced by Eagleyard Photonics (Eagleyard Photonics). The FAC 102 is a cylindrical lens having a focal distance 0.9 mm. The SAC 103 is a cylindrical lens having a focal distance of 20 mm. Consequently the cross sectional shape of the output laser light at the predetermined positions is obtained under the same conditions as that conducted for the external cavity semiconductor laser 60 with the beam-profile analyzer. The predetermined positions for observing the cross sectional shape of the output laser light are: point a that is 50 mm from an origin O where the origin O indicates a rear surface (the leftmost surface in the drawing) of the semiconductor laser device 101; point b that is 200 mm from the reference point O, and point c that is 500 mm from the reference point O. FIGS. 13 and 21 to 23 show the results. FIG. 21 shows the cross sectional shape at the point a that is 50 mm from the reference point. FIG. 22 shows the cross sectional shape at the point b that is 200 mm from the reference point O. FIG. 23 shows the cross sectional shape at the point c that is 500 mm from the reference point O. FIG. 13 shows the cross sectional shape of the output laser light at the reference point O. FIGS. 21 to 23 are also described in 10× scale with respect to FIG. 13.

Comparing the present invention based on FIGS. 14 to 16 with the conventional example based on FIGS. 21 to 23 reveals as follows:

(1) The laser light having 50 μm×4 μm (vertical direction) at the reference point O (o) as illustrated in FIG. 13 changes as shown in FIG. 21, i.e., 570 μm×360 μm at the point a, 580 μm×820 μm at the point b as shown in FIG. 22, and 1160 μm×2050 μm at the point c as shown in FIG. 23. That revealed difficulty in coinciding the cross sectional shape between the horizontal direction and the vertical direction because the laser light adjustment was different between the horizontal direction and the vertical direction;

(2) In contrast, in the external cavity semiconductor laser according to the present invention, the laser light having 50 μm (horizontal direction)×4 μm (vertical direction) at the reference point O (o) changes as follows: 570 μm×700 μm at the point A as illustrated in FIG. 14; 560 μm×710 μm at the point B as illustrated in FIG. 15; and 1170 μm×1040 μm at the point C as illustrated in FIG. 16. This results in revealing that the present invention can rectify the beam shape so as to coincide between the horizontal direction and the vertical direction.

INDUSTRIAL APPLICABILITY

The present invention having a simple structure including less number of components can provide high power output of laser light having an extremely low spectrum width, thereby providing an external cavity semiconductor laser of high quality and low price.

The external cavity semiconductor laser according to the present invention can be used for various technologies, e.g., optical communication, optical measurement, and optical fabrication.

What is claimed is:

1. An external cavity semiconductor laser comprising:
a semiconductor laser device for emitting laser light in at least two directions from a first end surface thereof, one of the laser light emitted from the semiconductor lasers device being an external cavity laser light, and the other laser light being an output laser light;

an optical beam-rectifying device disposed in the optical path of the external cavity laser light and in the optical path of the output laser light; and a reflecting unit including a reflective surface for reflecting only the external cavity laser light and a die-cut non-reflective region having a coating formed thereon selected from the group consisting of: a light absorbing coating; and an anti-reflection coating, wherein a beam shape of the external cavity laser light is adjusted by the coating and a shape of the non-reflective region, the optical beam-rectifying device includes: a first laser spreading angle-adjusting section for condensing the laser light in a first direction orthogonal to a surface including the optical axis of the laser light emitted in two directions from the semiconductor laser device; and a second laser spreading angle-adjusting section for condensing the laser light in both a first direction and a second direction where the second direction is orthogonal to the direction of a center axis that divides the optical axes of two laser lights emitted from the semiconductor laser device and orthogonal to the first direction.

2. The external cavity semiconductor laser according to claim 1, the first laser spreading angle-adjusting section is a fast axis collimator, and the second laser spreading angle-adjusting section is a slow axis collimator.

* * * * *